United States Patent [19]

Suzuki et al.

[11] Patent Number: 4,772,871
[45] Date of Patent: Sep. 20, 1988

[54] DELTA SIGMA MODULATOR CIRCUIT FOR AN ANALOG-TO-DIGITAL CONVERTER

[75] Inventors: Takao Suzuki; Yasuo Shoji; Yuichi Shiraki, all of Tokyo, Japan

[73] Assignee: Oki Electric Industry Co., Ltd., Tokyo, Japan

[21] Appl. No.: 46,783

[22] Filed: May 7, 1987

[30] Foreign Application Priority Data

May 16, 1986 [JP] Japan ................. 61-112127

[51] Int. Cl.$^4$ .............................................. H03M 1/00
[52] U.S. Cl. .................................. 341/155; 375/28; 375/33
[58] Field of Search ............... 340/347 AD; 375/25, 375/27, 28, 29, 33

[56] References Cited

U.S. PATENT DOCUMENTS 4,588,981 5/1986 Senn .................................. 375/33 X

OTHER PUBLICATIONS

*Technical Report of the Institute of Electronics and Communications Engineers of Japan*, CS-83-198, 83[307], pp. 93-100, "A study on Oversample-type A/D Converters".
*IEEE Transactions on Communications*, vol. COM-33, No. 3, Mar. 1985, pp. 249-258, "A Use of Double Integration in Sigma Delta Modulation", Candy.

*Primary Examiner*—William M. Shoop, Jr.
*Assistant Examiner*—Richard K. Blum
*Attorney, Agent, or Firm*—Spencer & Frank

[57] ABSTRACT

In a delta-sigma modulator for an A/D converter for modulating an analog input signal to produce a modulated signal of a digital form, a first integrator produces a first integral signal indicative of an integral of the difference between the analog input signal and feedback signal, a first delay element delays the first integral signal by one sampling period, a second integrator produces a second integral signal indicative of an integral of the difference between the output of the first delay element and the feedback signal, a first quantizer produces a two-level signal "1" or "0" depending on whether or not the second integral signal is greater than a predetermined reference, and a second quantizer produces a two-level signal "1" or "0" depending on whether or not the first integral signal is greater than a predetermined reference. An output digital signal is produced in accordance with the outputs of the first and the second quantizers. The feedback signal is also produced in accordance with the outputs of the first and the second quantizers.

17 Claims, 5 Drawing Sheets

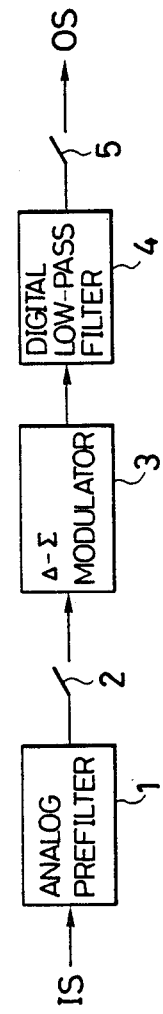
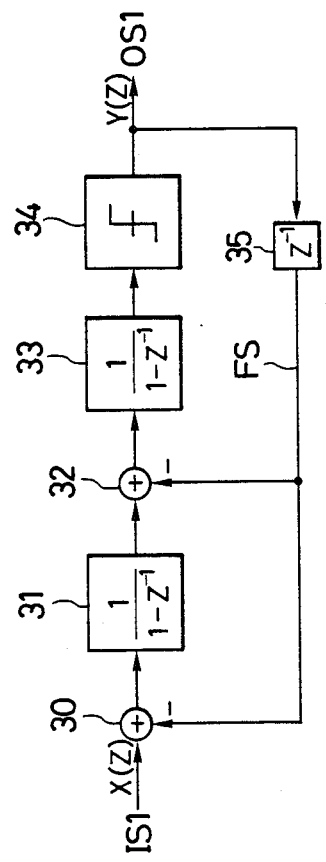

DELTA SIGMA MODULATOR CIRCUIT FOR AN ANALOG-TO-DIGITAL CONVERTER

BACKGROUND OF THE INVENTION

This invention relates to a delta-sigma modulator circuit used in an analog-to-digital converter that modulates analog signals such as voice-band signals for the purpose of converting these signals to digital signals in digital communication equipment. The modulated signal of a simple digital form are subsequently passed through a digital low-pass filter to be converted into PCM signals.

A prior art delta-sigma modulator and an A/D converter incorporating it are described in Technical Report CS83-198, 83[307] of the Institute of Electronics and Communications Engineers of Japan (1984-3-23), pp. 93–100. The circuit is explained below with reference to the drawings.

FIG. 1 is a block diagram showing a general construction of an analog-to-digital (A/D) converter. This A/D converter comprises an analog filter 1 for receiving the analog input signal IS, an oversampling sampler 2, a delta-sigma modulator 3, a digital low-pass filter 4, and a decimator sampler 5 for generating the digital output signal OS.

The analog input signal IS of the A/D converter is fed through the analog filter 1 to the sampler 2, which samples it at a rate higher than the Nyquist rate and sends the sampled signal to the delta-sigma modulator 3. The delta-sigma modulator 3 modulates the sampled signal and outputs the result (modulation) of in a digital form. This digital signal is fed through the digital low-pass filter 4 and sampler 5 to produce the digital output signal OS of the A/D converter.

As shown in the reference cited above, the integrating filter of the delta-sigma modulator 3 can be of the single or double integrating type. The double integrating type is necessary to provide 14-bit equivalent quantizing accuracy in the voice band for digital communications.

FIG. 2 is a diagram of the equivalent circuit of the double integrating delta-sigma modulator used in the prior art.

This circuit comprises a first adder 30 that obtains the difference between the analog input signal IS1 from the sampler 2 and the feedback signal FS, a first integrator 31 that integrates the output of the first adder 30 to produce the first integral signal, a second adder 32 that obtains the difference between the first integral signal and the feedback signal FS, a second integrator 33 that integrates the output of the second adder 32 to produce the second integral signal, and a quantizer 34 that quantizes the second integral signal to produce the digital output signal OS1. Connected in a feedback loop between the input and output ends is a delay element 35 that generates the feedback signal FS from the output signal OS1.

The transfer characteristic of the double integrating delta-sigma modulator in FIG. 2 can be expressed in terms of the Z transform. Let $X(Z)$ be the input signal IS1, $Y(Z)$ be the output signal OS1 and $Q(Z)$ be the quantizing noise generated by the quantizer 34. Then:

$$Y(Z) = X(Z) + (1 - Z^{-1})^2 \cdot Q(Z) \quad (1)$$

where $Z^{-1}$ signifies a unit delay element. Eq. 1 indicates that the output signal $Y(Z)$ has a flat in-band characteristic, its signal component being equal to the input signal $X(Z)$. The out-of-band noise component of the output signal $Y(Z)$ increases rapidly with the frequency, but if the noise is removed by a digital low-pass filter 4 provided at a succeeding stage as in FIG. 1, the final digital output signal OS is the quantized version of the analog input signal IS.

If the signal level range of the input signal IS1 is $|S| \leq 1$, then the overload levels of the input signal IS1 and the feedback signal FS from the quantizer 34 are both ±1. Accordingly, when the maximum voltage amplitude of the input signal IS1 is 1 V, the signal voltage of the feedback signal FS obtained by delaying the output signal OS1 is 1 V.

Suppose the quantizer 34 is a 1-bit quantizer that determines the polarity of its input, which is the second integral signal, and selects the voltage of its output signal OS1 accordingly: +1 V for a positive input and −1 V for a negative input. The double integrating delta-sigma modulator then integrates the difference between the input signal IS1 and the feedback signal FS by means of the first integrator 31, integrates the difference between this first integral signal and the feedback signal FS by means of the second integrator 33, determines the polarity of the resulting second integral signal by means of the quantizer 34, and produces a two-level quantized output signal OS1.

The double integrating delta-sigma modulator described above requires that the integral signal voltage of the first integrator 31 be 1 to 2 times as large as the input signal IS1, and that the integral signal voltage of the second integrator 33, be about 2 to 4 times as large. For this reason it is necessary to attenuate the input signal IS1 by a proportional amount, but this makes the circuit vulnerable to internal noise and degrades its overall signal-to-noise (S/N) characteristic.

SUMMARY OF THE INVENTION

An object of this invention is to provide a delta-sigma modulator circuit for an A/D converter that solves the problem of the poor S/N characteristic of the prior art as described above.

According to one aspect of the invention, there is provided a delta-sigma modulator for an A/D converter for receiving an analog signal and producing a digital signal which is a modulation of the analog signal, and comprising:

a first integrator for producing a first integral signal by integrating the difference between the analog signal and a feedback signal generated from the digital signal, a second integrator for producing a second integral signal by integrating the difference between the first integral signal and the same feedback signal, a quantizer for discriminating the level of the second integral signal by comparison with a reference and producing a two-level quantized signal, feedback delay means for receiving the digital signal and producing the feedback signal, delay means for delaying the first integral signal, a correcting quantizer for discriminating the level of the first integral signal by comparison with a reference and producing a two-level correcting quantized signal, and an adder/corrector for adding the quantized signal and the correcting quantized signal and producing a pair of two-level signals representing a corrected three-level quantized signal which constitutes the digital signal.

According to another aspect of the invention, there is provided a delta-sigma modulator for an A/D converter for modulating an analog input signal to produce a modulated signal of a digital form, said modulator comprising:

feedback means producing a feedback signal, first integrator means receiving the analog signal and the feedback signal and producing a first integral signal indicative of an integral of the difference between the two inputs, first delay means for delaying the first integral signal, by one sampling period, second integrator means receiving the output of the first delay means and the feedback signal and producing a second integral signal indicative of an integral of the difference between the two inputs, first quantizer means receiving the second integral signal and producing a two-level signal "1" or "0" depending on whether or not the second integral signal is greater than a predetermined reference, second quantizer means receiving the first integral signal and producing a two-level signal "1" or "0" depending on whether or not the first integral signal is greater than a predetermined reference, and means producing an output digital signal in accordance with the outputs of the first and the second quantizer means, said feedback means producing the feedback signal in accordance with the outputs of the first and the second quantizer means.

According to a further aspect of the invention, there is provided an A/D converter having a delta-sigma modulator for modulating an analog input signal to produce a modulated signal of a digital form and a digital low-pass filter for converting the modulated signal to a PCM signal, said delta-sigma modulator comprising:

feedback means producing a feedback signal, first integrator means receiving and sampling an analog signal and receiving the first feedback signal and producing a first integrated signal indicative of an integral of the difference between the sampled analog signal and the feedback signal, first delay means for delaying the first integral signal, by one sampling period, second integrator means receiving the output of the first delay means and the feedback signal and producing a second integral signal indicative of an integral of the difference between the two inputs, first quantizer means receiving the second integral signal and producing a two-level signal "1" or "0" depending on whether or not the second integral signal is greater than a predetermined reference, second quantizer means receiving the first integral signal and producing a two-level signal "1" or "0" depending on whether or not the first integral signal is greater than a predetermined reference, and means producing an output digital signal in accordance with the outputs of the first and the second quantizer means, said feedback means producing the feedback signal in accordance with the outputs of the first and the second quantizer means.

BRIEF DESCRIPTION OF THE DRAWINGS

In the accompanying drawings:

FIG. 1 is a block diagram of an A/D converter including a delta-sigma modulator;

FIG. 2 is a block diagram of a prior art double-integrating delta-sigma modulator;

DETAILED DESCRIPTION OF THE PREFERRED EMBODIMENTS

Figure 3:
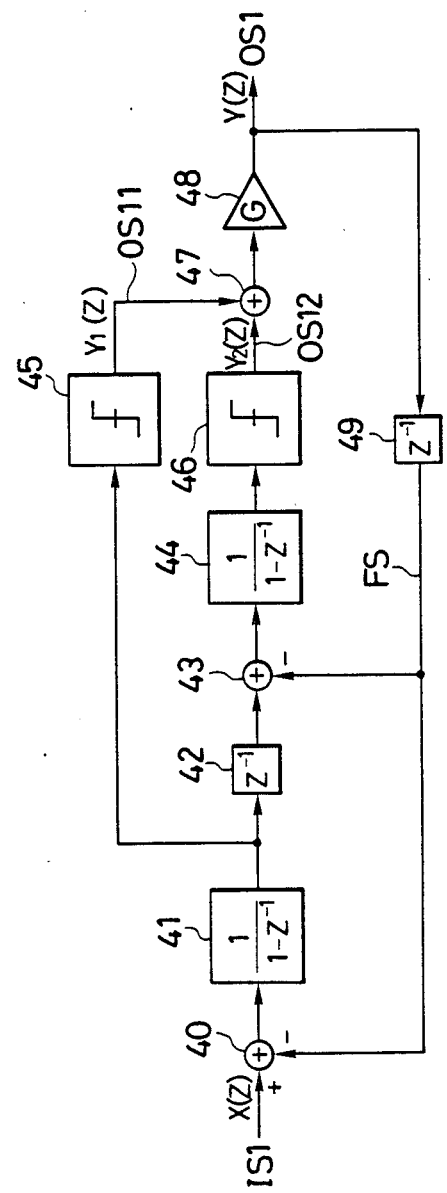
FIG. 3 is a block diagram of a delta-sigma modulator of an embodiment of the invention.

FIG. 3 is a block diagram showing the Z-transformed equivalent circuit of an example of a double integrating delta-sigma modulator embodying the present invention. This delta-sigma modulator circuit can be incorporated in the delta-sigma modulating A/D converter shown in FIG. 1. It comprises a first adder 40, a first integrator 41, a first delay element 42, a second adder 43, a second integrator 44, a first quantizer 45, a second quantizer 46, a third adder 47, and a correcting amplifier 48 connected in the forward direction from the input end to the output end and having a gain of ½, and a second, feedback delay element 49 connecting the output to the input in the reverse direction, and delaying the signal by one sampling period.

The first adder 40 obtains the difference of the analog input signal IS1 of the circuit and the feedback signal FS output from the second feedback delay element 49 and sends this difference signal to the first integrator 41. The first integrator signal output from the first integrator 41 is input to both the first delay element 42 and the first quantizer 45. The first quantizer 45 determines the polarity of the first integral signal which it receives as its input and generates a two-level quantized signal OS11 which it feeds to the third adder 47. The first integral signal, which is input to the first delay element 42, is delayed by one sampling period and fed to the second adder 43 together with the feedback signal FS from the second feedback delay element 49. The second adder 43 obtains the difference of these two signals, which is integrated by the second integrator 44 to produce the second integral signal. This second integral signal is input to the second quantizer 46, which determines its polarity and generates a two-level quantized signal OS12, which is input to the third adder 47.

The third adder 47 adds the two-level quantized signal OS11 from the first quantizer 45 to the two-level quantized signal OS12 from the second quantizer 46 and outputs the sum. This sum output is passed through and the magnitudes of its components are halved by the correcting amplifier 48 to become the three-level digital output signal OS1 whose value is either +1, 0 or −1. The output signal OS1 is input to the second feedback delay element 49 to generate the feedback signal FS which is supplied to the first and second adders 40 and 43. The third adder 47 and the correcting amplifier 48, in combination form an adder/corrector circuit.

The above circuit implementation is distinguished from the prior art shown in FIG. 2 by the addition of the first delay element 42, the first quantizer 45, the third adder 47, and the correcting amplifier 48.

The transfer characteristic of the above delta-sigma modulator circuit configuration can be described using the Z-transform. Let X(Z) be the input signal IS1, Y(Z) be the output signal OS1, $Y_1(Z)$ and $Q_1(Z)$ be the output signal OS11 of the first quantizer 45 and its quantizing noise, $Y_2(Z)$ and $Q_2(Z)$ be the output signal OS12 of the second quantizer 46 and its quantizing noise, and G be the gain of the correcting amplifier 48. Assume G=0.5, and that:

$$Y(Z) = G \cdot \{Y_1(Z) + Y_2(Z)\} \quad (2)$$

$$Q(Z) = Q_1(Z) + Q_2(Z) \quad (3)$$

Then, $$Y(Z) = F(Z) \cdot \{X(Z) + (1 - Z^{-1})^2 \cdot Q(Z)\} \quad (4)$$

where $$F(Z) = 0.5/(1 - Z^{-1} + 0.5Z^{-2}) \quad (5)$$

Let us compare this with the transfer characteristic (1) of the double integrating delta-sigma modulator of the prior art. From Eqs. (4) and (5), when the transform X(Z) of the input signal IS1 is converted to the transform Y(Z) of the output signal OS1, the transfer function F(Z) is a coefficient of X(Z), that is the result of multiplying X(Z) by this filter characteristic F(Z) is the output Y(Z). In the transfer characteristic of the prior art (1), the signal component of Y(Z) matches X(Z), while in the transfer characteristic (4) embodying this invention it does not. If the transfer function (5) has a nearly flat characteristic in the required signal band, however, the in-band signal component of Y(Z) is nearly equal to X(Z). In the A/D converted signal, the noise component of Y(Z) located outside the signal band is removed by a digital low-pass filter as in FIG. 1.

The first integrator 41 and second integrator 44 in FIG. 3 are both complete integrators and the first quantizer 45 and second quantizer 46 are one-bit quantizers that produce two-level outputs. The overload levels of the input signal IS1 and the feedback signal FS obtained from the output signal OS1 are both ±1, so if the two-level values of the first and second quantized signals OS11 and OS12 are (+1, −1), their corrected sum, the corrector output signal OS1, can have three values (+1, 0, −1).

In a delta-sigma modulator, the integral signal voltages of the integrators (the internal operation voltages) can vary by large amounts. Under the practical design conditions, the internal operating voltage of the circuit must be about double the input signal voltage. In the double integrating delta-sigma modulator of the prior art, the peak internal operating voltage occurs at the second integrator 33 in FIG. 2.

Figure 4:
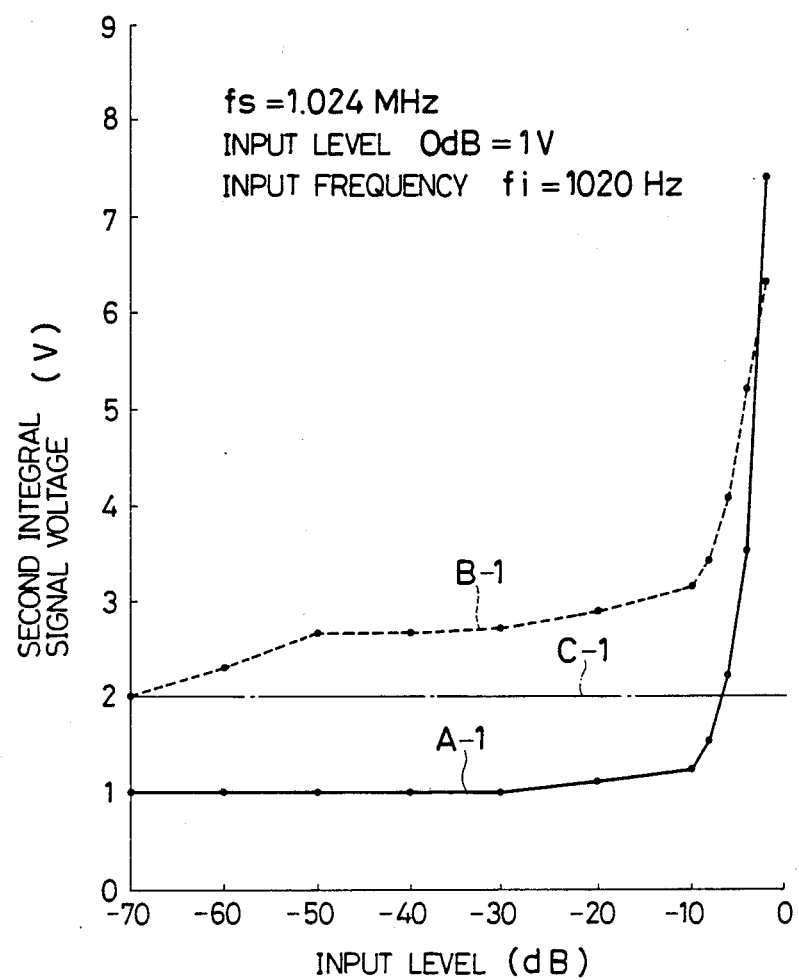
FIG. 4 shows a second integral signal voltage versus input signal level characteristics.

To compare the implementation of the present invention described above with the prior art, the relationship between the second integral signal level and the input level was determined by computer simulation as shown in FIG. 4. The solid line A-1 in FIG. 4 is the characteristic for the present invention and the dashed line B-1 is the characteristic for the prior art. The simulation conditions were an oversampling frequency $f_s$ of 1.024 MHz, a sinewave input signal with frequency $f_i$ of 1020 Hz, and a 0 dB input level of 1 V. The straight index line C-1 is the 2 V line.

As indicated by the dashed line B-1, in the prior art, as the input level varies from −70 dB to −10 dB, the voltage of the second integral signal rises from 2.0 V to 3.1 V. This means that at input levels in the range from −70 dB to −10 dB, the voltage of the second integral signal becomes roughly three times the voltage of the input signal IS1, so the voltage of the input signal IS1 is limit to about ⅓ of the internal operating voltage. This factor degrades the S/N characteristics of the actual circuits due to the effect of internal noise.

To solve this problem, this invention makes the internal operating voltage roughly equal to the voltage of the input signal IS1 by adding the output of the first quantizer 45 and second quantizer 46, correcting the sum, and generating a feedback signal from the resulting three-level output as in FIG. 3. Computer simulation shows that over the range of input levels from −70 dB to −10 dB, the second integral signal voltage varies between 1.0 V and 1.2 V as indical by the solid line A-1 in FIG. 4. The internal operating voltage is thus restricted to approximately the same value as the voltage of the input signal IS1.

Figure 5:
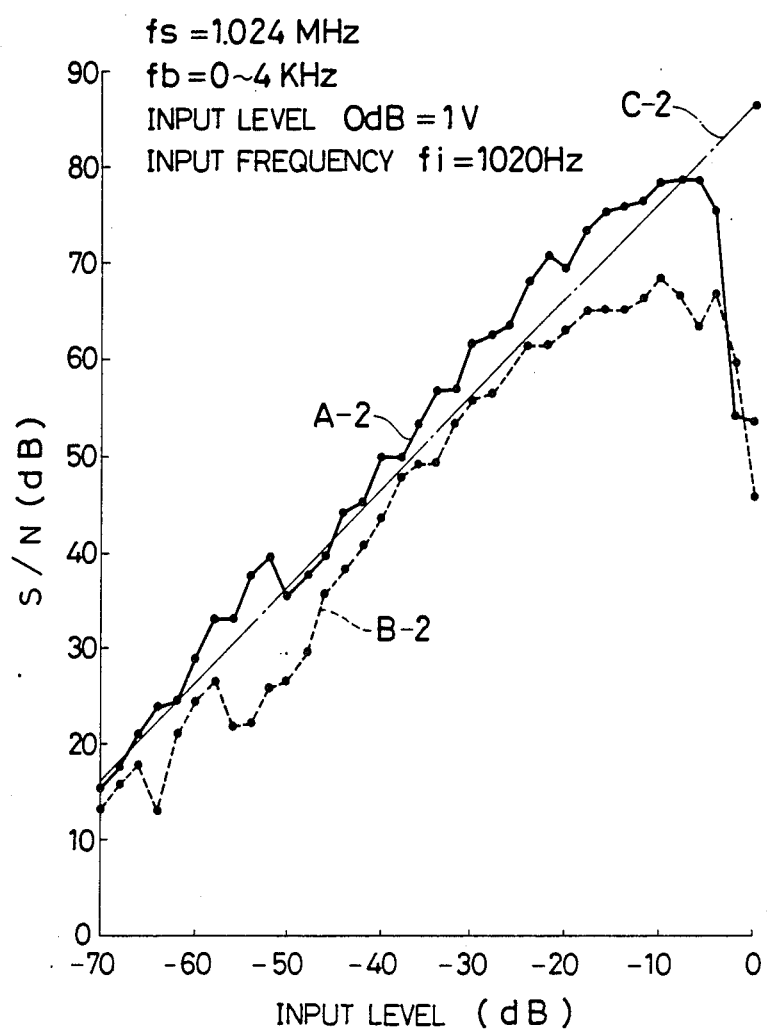
FIG. 5 show an S/N versus input signal level characteristics.

Consider next the cases of a practical delta-sigma modulator circuit design in which the internal operating voltage is limited to twice the voltage of the input signal IS1. FIG. 5 shows a computer simulation of the relationship between the S/N characteristic and input level of the delta-sigma modulator of the prior art shown in FIG. 2 and the delta-sigma modulator of the present invention shown in FIG. 3 under the above condition: that is, voltage limiters were added to each circuit to restrict the internal operating voltage at the outputs of the first integrators 31 and 41 and the second integrators 33 and 44, the points of peak internal operating voltage, to twice the voltage of the input signal IS1.

In the computer simulation in FIG. 5, to evaluate the performance of the delta-sigma modulator as an A/D converter, a decimator consisting of a second digital low-pass filter 4 was added to a stage succeeding the modulator. The 32 kHz, 15-bit decimator output was evaluated in the voice band ($f_b$=0 to 4 kHz) under the conditions of sinewave signal input with frequency $f_i$=1020 Hz, with 0 dB corresponding to an input level of 1 V. The solid line A-2 in FIG. 5 is the characteristic for the present invention. The dashed line B-2 is the characteristic for the prior art. The index line C-2 indicates 14-bit quantizing accuracy.

Addition of the decimator as described above converts high-rate sampled data with a small number of bits to low-rate sampled data with a larger number of bits, which constitutes a digital output of the A/D converter. The transfer function $H_d(z)$ of the decimator is:

$$H_d(Z) = \left(\frac{1}{64} \cdot \frac{1 - z^{-64}}{1 - z^{-1}}\right) \cdot \left(\frac{1}{4} \cdot \frac{1 - z^{-4}}{1 - z^{-1}}\right) \times \left(\frac{1}{8} \cdot \frac{1 - z^{-32}}{1 - z^{-4}}\right)^2 \quad (6)$$

When the oversampling frequency $f_s$ is 1.024 MHz, this decimator reduces the frequency by a factor of 32 to 32 kHz.

As indicated by the dashed line B-2 in FIG. 5, in the prior art the S/N ratio suffers severe degradation and the circuit cannot meet the standard of 14-bit equivalent quantizing accuracy indicated by the index line C-2. The circuit implementing the present invention, however, has a good S/N characteristic and provides 14-bit equivalent quantizing accuracy throughout the wide range of input levels from −70 dB to −8 dB.

If the voltage limiting circuit in the simulation in FIG. 5 sets a limiting voltage of 1.5 times the voltage of the input signal IS1, the circuit of the prior art can no longer operate, but the circuit of the present invention operates normally for input levels in the wide range from −70 dB to −10 dB, providing the same S/N characteristic as indicated by the solid line A-2 in FIG. 5.

The advantages shown by this embodiment of the present invention can be summarized as follows.

(a) Addition of the first delay line 42, the first quantizer 45, the third adder 47, and the correcting amplifier 48 shown in FIG. 3 to the double integrating delta-sigma modulator of the prior art enables the internal operating voltage of the circuit to be held to approximately the same voltage as the input signal IS1, thereby relaxing constraints the actual circuit design.

(b) In an A/D converter comprising a delta-sigma modulator embodying this invention and a digital low-pass filter 4, if voltage limiting circuits are added to the outputs of the first and second integrators 41 and 44 to limit the internal operating voltage to, say, 1.5 to 2 times the voltage of the input signal IS1, the resulting circuit has a good S/N characteristic, providing 14-bit equivalent quantizing accuracy. This result also relaxes constraints on practical circuit designs.

(c) The operating speed of the circuit elements, particularly the integrator 41 and 44, can be one half of that of the elements in the prior art. This is because the integration by the integrator 44 is done using the result of the integration by the integrator 41 one sampling period before. The integration operations at the integrators 41 and 44 can be conducted spending almost all the full sampling period. In the prior art, only the former half of the sampling period is available for the integration by the first integrator 31 and only the latter half of the sampling period is available for the integration by the second integrator 33.

(d) The two-level signals are produced and are digitally synthesized to produce a three-level signal. Accordingly, a stable operation is ensured.

In the embodiment described, the quantizers 45 and 46 determines the polarity of the input signal. The quantizers 45 and 46 may alternatively be so formed as to determine whether the input signal is larger than a reference (which may be other than zero), i.e., to discriminate the level of the input signal by comparison with a reference.

In the embodiment described, the integrators 41 and 44 are complete integrators. But leaky integrators which can be implemented more easily in practice can be used instead. The transfer function of the leaky integrator is given by:

$$1/(1-aZ^{-1})$$

where $0<a<1$, preferably $0.8 \leq a \leq 0.9$. Similar results are obtained as long as the gains of the operational amplifiers incorporated in the integrators is about 60 dB.

Figure 6:
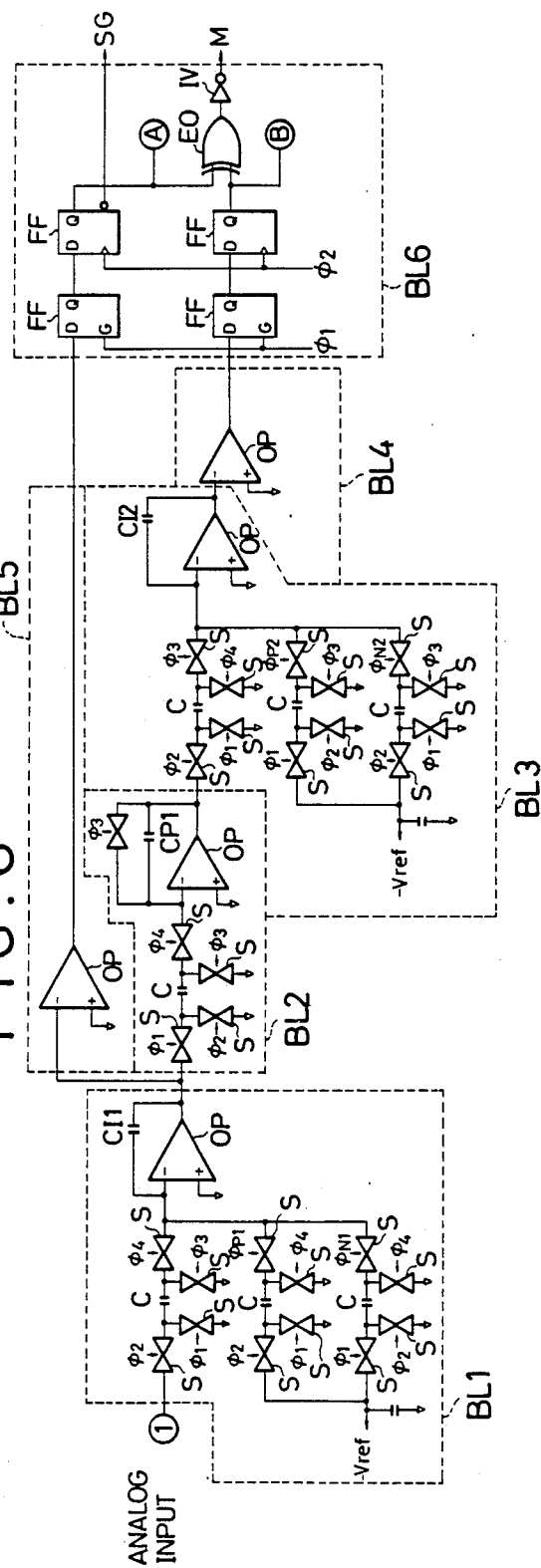
FIGS. 6 and 7 are circuit diagrams showing an example of a circuit configuration implementing the system of FIG. 3.

The system of FIG. 3 can be implemented by a circuit shown in FIG. 6. In FIG. 6, the block BL1 corresponds to the combination of the sampler 2 in FIG. 1, and the adder 40 and the integrator 41, in FIG. 3. The block BL2 corresponds to the delay element 42 in FIG. 3. The block BL3 corresponds to the combination of the adder 43 and the intergrator 44. The blocks BL4 and BL5 correspond to the quantizers 46 and 45, respectively.

The block BL6 corresponds to the combination of the adder 47 and the amplifier 48.

In FIG. 6, each of the switches S is closed when the corresponding control signal $\phi_1$, $\phi_2$, etc is applied.

It can be considered, for the purpose of the present description that $\phi_1$ to $\phi_4$ represent clock pulses, and that $\phi_1$ and $\phi_3$ are produced simultaneously and $\phi_2$ and $\phi_4$ are produced simultaneously.

The block BL1 having a function of sampling, addition and integration receives at its first input an analog input signal, and receives at its second input a voltage −Vref whose magnitude is the maximum value of the operating range of the analog input signal. The block BL3 having a function of addition and integration receives at its first input the output of the block BL2 (delay element) and receiving at its second input a voltage −Vref whose magnitude is the maximum value of the operating range of the analog input level.

The blocks BL1 to BL3 are called switched capacitor type circuits and operate in synchronism with each other at the sampling rate in a known manner. Briefly, by sequential closing of the switches S, the capacitors C are charged and discharged and signals are thereby transmitted and input to the operational amplifiers OP at respective desired timings and with desired polarities.

Figure 7:
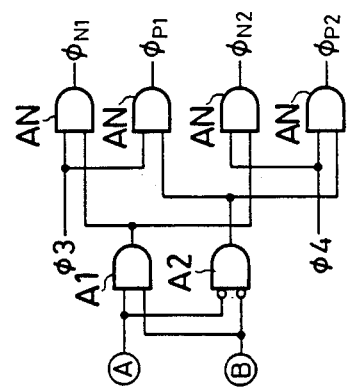

The signals $\phi_{P1}$, $\phi_{N1}$, $\phi_{P2}$, $\phi_{N2}$ are produced from the signals A and B which reflect the results of the quantization. More specifically, as shown in FIG. 7, when A and B are both "1", the signals $\phi_{N1}$, $\phi_{N2}$ are produced in synchronisum with $\phi_3$. When A and B are both "0", the signals $\phi_{N1}$, $\phi_{P2}$ are produced in synchronism with $\phi_3$. When the switches controlled by the signals $\phi_{P1}$ and $\phi_{P2}$ are closed, a non-inverting signal representing "+1" is applied to the operational amplifiers. When the switches controlled by the signals $\phi_{N1}$ and $\phi_{N2}$ are closed, an inverting signal representing "−1" is applied to the respective operational amplifiers. When the feedback value is "0", none of the signals $\phi_{P1}$, $\phi_{P2}$, $\phi_{N1}$, $\phi_{N2}$ are produced and the switches controlled thereby are kept opened. The magnitudes of the signals for the values "+1", "−1" as determined by −Vref are the maximum value of the operating range of the analog input signal.

The quantizers BL2, BL5 are in the form of comparators formed also of an operational amplifier OP whose reference input (+) is grounded.

The block BL6 corresponding to the adder 47 and the correcting amplifier 48 comprises flip-flops FF, an exclusive-OR gate EO and an inverter IV. The signals fed back to the blocks BL1 and BL3 are in the form of a combination of two-level signals, but they collectively represent a three-level signal, i.e., +1, −1, or 0.

The signals as output from the modulator are also a combination of two-level signals M and SG. The signal M represents the magnitude (1 or 0) of the three-level signal and the signal SG represents sign (+ or −) of the three level signal. Hence, these two signals collectively represent three-level signals +1, 0 (+ or −), and −1. These signals are input to a digital low-pass filter and are processed in a known manner.

As described in detail above, this invention comprises a correcting quantizer for discriminating the level of the second integral signal by comparison with a reference and outputting a two-level correcting quantized signal, a delay line for delaying the first integral signal, and a correcting adder circuit for adding the two-level quantized signal to the two-level correcting quantized signal and outputting the corrected sum as a three-level quantized signal. These provisions enable the internal operating voltage of the delta-sigma modulator to be held to the same level as the input signal voltage, making the circuit less vulnerable to the effects of internal noise. Since the input signal voltage of the delta-sigma modulator can therefore vary out to the limits of the operating voltage range of the circuit, a good S/N characteristic can be obtained.

What is claimed is:

1. A delta-sigma modulator for an A/D converter for receiving an analog signal and producing a digital signal which is a modulation of the analog signal, and comprising:

a first integrator for producing a first integral signal by integrating the difference between the analog signal and a feedback signal generated from the digital signal, a second integrator for producing a second integral signal by integrating the difference between the first integral signal and the same feedback signal, a quantizer for discriminating the level of the second integral signal by comparison with a reference and producing a two-level quantized signal, feedback delay means for receiving the digital signal and producing the feedback signal, delay means for delaying the first integral signal, a correcting quantizer for discriminating the level of the first integral signal by comparison with a reference and producing a two-level correcting quantized signal, and an adder/corrector for adding the quantized signal and the correcting quantized signal and producing a pair of two-level signals representing a corrected three-level quantized signal which constitutes the digital signal.

2. A modulator according to claim 1, wherein the corrected three-level signal has a value "+1" when the two-level signals output by the quantizers are both "1", has a value "−1" when the two-level signals are both "0", and has a value "0" when one of the two-level signal is "1" and the other two-level signal is "0".

3. A modulator according to claim 2, wherein the magnitudes of the feedback signals of values "+1" and "−1" are the maximum values of the operating range of the analog input signal.

4. A delta-sigma modulator for an A/D converter for modulating an analog input signal to produce a modulated signal of a digital form, said modulator comprising:

feedback means producing a feedback signal, first integrator means receiving the analog signal and the feedback signal and producing a first integral signal indicative of an integral of the difference between the two inputs, first delay means for delaying the first integral signal, by one sampling period, second integrator means receiving the output of the first delay means and the feedback signal and producing a second integral signal indicative of an integral of the difference between the two inputs, first quantizer means receiving the second integral signal and producing a two-level signal "1" or "0" depending on whether or not the second integral signal is greater than a predetermined reference, second quantizer means receiving the first integral signal and producing a two-level signal "1" or "0" depending on whether or not the first integral signal is greater than a predetermined reference, and means producing an output digital signal in accordance with the outputs of the first and the second quantizer means, said feedback means producing the feedback signal in accordance with the outputs of the first and the second quantizer means.

5. A modulator according to claim 4, wherein the feedback means produces the feedback signal of a value "+1" when the outputs of the first and the second quantizers are both "1", produces the feedback signal of a value "−1" when the outputs of the first and the second quantizers are both "0", and produces the feedback signal of a value "0" when one of the outputs of the first and the second quantizers is "1" and the other output is "0".

6. A modulator according to claim 5, wherein the magnitudes of the feedback signals of values "+1" and "−1" are the maximum values of the operating range of the analog input signal.

7. A modulator according to claim 4, wherein the feedback means, the first integrator means, the first delay means, the second integrator means, the first quantizer means, and the second quantizer means operate periodically at the sampling rate.

8. A modulator according to claim 4, wherein the first integrator means comprises a switched capacitor type adder/integrator receiving at a first input the analog input signal and receiving at a second input the voltage of the maximum value of the operating range, the switches associated with the second input being controlled in accordance with the outputs of the first and the second quantizer means.

9. A modulator according to claim 4, wherein the second integrator means comprises a switched capacitor type adder/integrator receiving at a first input the output of the first quantizer means, and receiving at a second input the voltage of the maximum value of the operating range, the switches associated with the second input being controlled in accordance with the outputs of the first and the second quantizer means.

10. A modulator according to claim 4, wherein the feedback means comprises delay means for delaying the outputs of the first and the second quantizer means by one sampling period.

11. An A/D converter having a delta-sigma modulator for modulating an analog input signal to produce a modulated signal of a digital form and a digital low-pass filter for converting the modulated signal to a PCM signal, said delta-sigma modulator comprising:

feedback means producing a feedback signal, first integrator means receiving and sampling an analog signal and receiving the first feedback signal and producing a first integral signal indicative of an integral of the difference between the sampled analog signal and the feedback signal, first delay means for delaying the first integral signal, by one sampling period, second integrator means receiving the output of the first delay means and the feedback signal and producing a second integral signal indicative of an integral of the difference between the two inputs, first quantizer means receiving the second integral signal and producing a two-level signal "1" or "0" depending on whether or not the second integral signal is greater than a predetermined reference, second quantizer means receiving the first integral signal and producing a two-level signal "1" or "0"

depending on whether or not the first integral signal is greater than a predetermined reference, and means producing an output digital signal in accordance with the outputs of the first and the second quantizer means, said feedback means producing the feedback signal in accordance with the outputs of the first and the second quantizer means.

12. An A/D converter according to claim 11, wherein the feedback means produces the feedback signal of a value "+1" when the outputs of the first and the second quantizers are both "1", produces the feedback signal of a value "−1" when the outputs of the first and the second quantizers are both "0", and produces the feedback signal of a value "0" when one of the outputs of the first and the second quantizers is "1" and the other output is "0".

13. An A/D converter according to claim 12, wherein the magnitudes of the feedback signals of values "+1" and "−1" are the maximum values of the operating range of the analog input signal.

14. An A/D converter according to claim 11, wherein the feedback means, the first integrator means, the first delay means, the second integrator means, the first quantizer means, and the second quantizer means operate periodically at the sampling rate.

15. An A/D converter according to claim 11, wherein the first integrator means comprises a switched capacitor type adder/integrator receiving at a first input the analog input signal and receiving at a second input the voltage of the maximum value of the operating range, the switches associated with the second input being controlled in accordance with the outputs of the first and the second quantizer means.

16. An A/D converter according to claim 11, wherein the second integrator means comprises a switched capacitor type adder/integrator receiving at a first input the output of the first quantizer means, and receiving at a second input the voltage of the maximum value of the operating range, the switches associated with the second input being controlled in accordance with the outputs of the first and the second quantizer means.

17. An A/D converter according to claim 11, wherein the feedback means comprises delay means for delaying the outputs of the first and the second quantizer means by one sampling period.

* * * * *